United States Patent [19]

Hobbs

[11] Patent Number: 4,754,430

[45] Date of Patent: Jun. 28, 1988

[54] MEMORY CELL WITH DUAL COLLECTOR, ACTIVE LOAD TRANSISTORS

[75] Inventor: James B. Hobbs, Minneapolis, Minn.

[73] Assignee: Honeywell Inc., Minneapolis, Minn.

[21] Appl. No.: 943,986

[22] Filed: Dec. 18, 1986

[51] Int. Cl.[4] .................... G11C 13/00; G11C 11/40
[52] U.S. Cl. ................................... 365/155; 365/154; 357/43
[58] Field of Search ............... 365/154, 155, 189, 230; 357/43

[56] References Cited

U.S. PATENT DOCUMENTS 4,538,244 8/1985 Sugo et al. ..................... 365/155

Primary Examiner—Terrell W. Fears
Attorney, Agent, or Firm—William T. Udseth

[57] ABSTRACT

A memory cell includes two active load, pnp transistors, and two npn switching transistors. The collector and base regions of the switching transistors are cross coupled. Each of the load transistors have two collectors, with the base of each load transistor directly connected to only one of its two collectors. The additional collector prevents the switching transistors from heavily saturating and thus increases the speed of operation of the cell.

7 Claims, 2 Drawing Sheets

DUAL COLLECTOR CELL

CTS CELL

DUAL COLLECTOR CELL

MEMORY CELL WITH DUAL COLLECTOR, ACTIVE LOAD TRANSISTORS

BACKGROUND OF THE INVENTION

1. Field of the Invention

This invention relates to solid state memory cells wherein cross coupled bipolar switching transistors utilize dual collector bipolar transistors as active loads.

2. Related Art

FIG. 1 shows an active load bipolar RAM memory cell 10 referred to as a complementary transistor switch (CTS) cell. Therein bipolar switching transistors 12 and 14 each have their bases connected to the collector of the other switching transistor. Transistors 12 and 14 employ bipolar transistors 16 and 18, respectively, as active loads. Two read/write Schottky diodes 20 and 22, and anti-saturation clamp Schottky diodes 24 and 26 complete cell 10.

In operation, cell 10 is either in standby, read or write mode. In standby, load transistor 16 or 18 is conducting and diodes 20 and 22 are non-conducting. Excess switching transistor base current is directed through anti-saturation diode 24 or 26. This prevents a build-up of carriers in the bases of the switching transistors, thus preparing the cell for fast switching. It also improves the speed of the CTS cell as compared to a standard silicon controlled rectifier (SCR) cell where diodes 24 and 26 are not used.

During a read or write operation, the load transistors are off. Current is supplied to the switching transistors only through the bit lines. For a write, the selected bit line voltage is raised sufficiently to flip the direction of current flow in the switching transistors.

The use of an active load affords a nonlinear voltage response to current injected into the load transistors. Thus, less current is needed to operate the cell than cells employing linear resistors as the load.

A merged transistor layout is employed where the same doped region is used for two different transistors where possible (e.g., the base of transistor 12 is the collector of transistor 16). This, along with the absence of resistors in the cell, results in a very compact structure.

Despite the many advantages of the CTS cell, disadvantages remain. Schottky diodes 20 and 22 must remain on (i.e. be forward biased) in the standby mode. This reduces the voltage differential of the cell thereby reducing noise margins. Further, the dependence on reliable Schottky diodes increases processing difficulties.

A memory cell which retains the advantages of the CTS cell yet affords improved noise margins and does not employ Schottky diodes is highly desirable.

SUMMARY OF THE INVENTION

A solid state memory cell includes two cross coupled npn switching transistors, and two pnp active load transistors. Each active load transistor has two collectors. In each load transistor, one of the collectors is directly connected to the base. The additional collector in the load transistors acts as an additional current source for the collector of one of the switching transistors. The result is less heavily saturated switching transistors and a faster operating cell than a cell where the load transistors have only one collector.

DESCRIPTION OF THE PREFERRED EMBODIMENT

Figure 1:
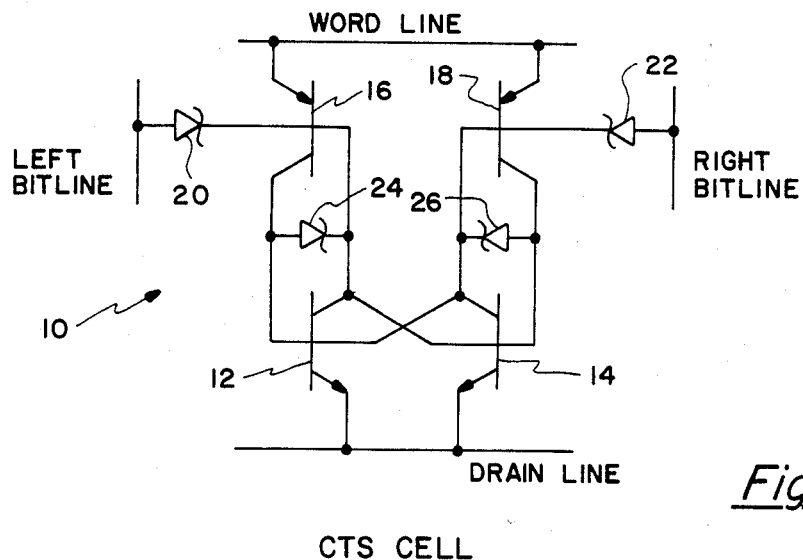
FIG. 1 is a schematic of a related art, CTS memory cell.

Memory cell 28 (FIG. 2) incorporates the present invention, and includes first and second pnp bipolar active load transistors $T_1$ and $T_2$, and first and second npn bipolar switching transistors $T_3$ and $T_4$. Cell 28 is configured in FIG. 2 as a RAM cell for illustrative purposes.

The emitters 30 and 32 of $T_1$ and $T_2$ are connected at node 34 which leads to wordline 36. Transistor $T_1$ has two collectors (i.e., 38 and 40), as does transistor $T_2$ (i.e. 42 and 44). Collector 40 of $T_1$ is directly connected to the base 46 of $T_1$, and collector 44 of $T_2$ is directly connected to the base 48 of $T_2$.

Preferably, merged transistor configurations are employed to form $T_1$ and $T_3$, and to form $T_2$ and $T_4$. Thus, the collector 50 of $T_3$ is also the base 46 of $T_1$ and the base 52 of $T_3$ is also collector 38 of $T_1$. Likewise, the collector 54 of $T_4$ is also the base 48 off $T_2$ and the base 56 of $T_4$ is also collector 42 of $T_2$. The first emitter 60 of $T_3$ is directly connected to the first emitter 62 of $T_4$ at node 64. Node 64 in turn is connected to standby line 66.

Cell 28 is completed by the cross coupling of base 52 of $T_3$ to collector 54 of $T_4$ (i.e., by conductive line 80), and of base 56 of $T_4$ to collector 50 of $T_3$ (i.e., by conductive line 82).

The above described connections of $T_1$, $T_2$, $T_3$ and $T_4$ provide a bistable, regenerative circuit.

In one RAM cell configuration; cell 28 connects to left and right bit lines 68 and 70, by way of second emitters 72 and 74 of $T_3$ and $T_4$, respectively. In an alternative RAM cell configuration, cell 28 connects to left and right bit lines 68 and 70 by way of diodes (preferrably Schottky diodes) 76 and 78. The operation of cell 28 as RAM cell will be described below with regard only to the first configuration.

In the example of a RAM cell, cell 28 operates in one of three modes—standby, read or write. In each mode only "one-half" of cell 28 will be conducting, the other half will be nonconducting. $T_1$ and $T_3$ form one half of cell 28, $T_2$ and $T_4$ the other half.

In the standby mode, the wordline voltage is low and the voltage on both bit lines is high. Current is drawn by standby line 66 from wordline 36 through, for example, $T_2$ and $T_4$ (i.e., $T_2$ and $T_4$ are each on, and $T_1$ and $T_3$ are each off). The current flows primarily through emitter 62 of $T_4$ with little, if any, current through emitter 74 to bit line 70. The collector current of $T_4$ is provided by both the base 48 of $T_2$ and the second collector 44 of $T_2$. The base current of $T_4$ is provided solely from the first collector 42 of $T_2$. If the second collector 44 of $T_2$ were not present, the collector current of $T_4$ would equal the base current of $T_2$, and the base current of $T_4$ would equal the collector current of $T_2$. In that case, both $T_2$ and $T_4$ would be heavily saturated, resulting in relatively slow transistor switching and slow cell operation.

However, with the second collector 44, the base current of $T_2$ is less than the collector current of $T_4$. This increases the collector to base current ratio (i.e., $\beta_F$) of $T_4$, which means that $T_4$ is not as heavily saturated. The less heavily saturated transistor $T_4$ can switch faster and cell 28 can operate faster than a cell without the second collector. Of course, the same speed advantage will hold true for $T_3$ if the left half of cell 28 were conducting instead of the right half.

To read cell 28, the wordline voltage is raised. The voltage on the bit line connected to the conducting side of cell 28 will be high, and the voltage on the other bit line will be low. Substantial current will now be drawn through both emitters 62 and 74 of $T_4$.

To write in cell 28, the wordline voltage will be raised from the standby voltage and (for the case where initially $T_2$ and $T_4$ are conducting) the voltage on the left bit line 68 lowered to below its read voltage. $T_2$ and $T_4$ will switch off, $T_1$ and $T_3$ will switch on, and current will flow from wordline 36 to bit line 68 through emitter 72 of $T_3$. Emitter 60 of $T_3$ will then conduct.

Figure 4:
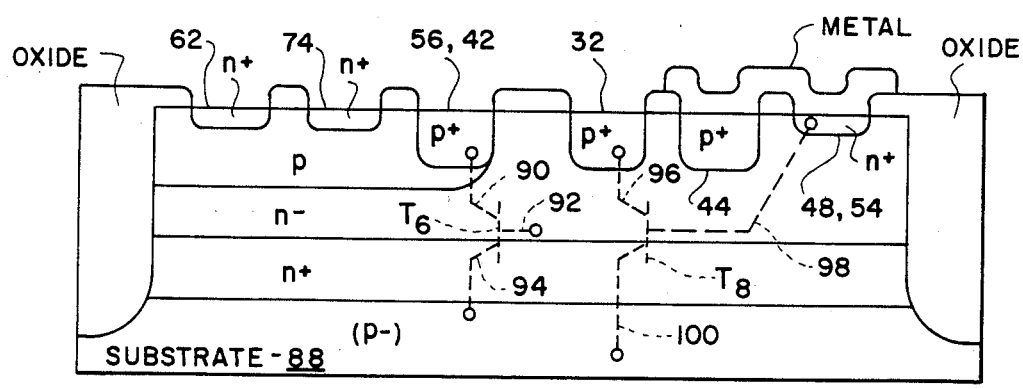
FIG. 4 is a sectional view of a monolithic IC implementation of half of the memory cell of the present invention.

Cell 28 as implemented in FIG. 4 includes parasitic vertical pnp transistors T6 and T8 in each of the two halves of the cell. For the right half of cell 28, emitter 90 of T6 is the base 56 of $T_4$ and collector 42 of $T_2$. Base 92 of T6 is the collector 54 of $T_4$ and base 48 of $T_2$. Collector 94 of T6 is the substrate, 88. For transistor T8, emitter 96 is the emitter 32 of $T_2$, base 98 is collector 54 of $T_4$ and base 48 of $T_2$, and collector 100 is the substrate, 88. These transistors (T6 and T8) are also present in similar implementations of a CTS cell or standard SCR cell.

For cell 28, the CTS cell and a standard SCR cell, transistors T6 and T8 are conducting in the half of the cell which is conducting. The collector current for T6 and T8 goes into the substrate, resulting in wasted power and slower cell operation. It is desirable to minimize this current into the substrate to reduce power dissipation and increase write speed for the cell.

In a standard SCR cell, both the load transistor and the switching transistor which are conducting are heavily saturated. This results in large base-emitter voltages on T6 and T8. For both cell 28 and the CTS cell, the load and switching devices are less heavily saturated, so the base-emitter voltages on T6 and T8 are lower and less current is wasted into the substrate.

Figure 2:
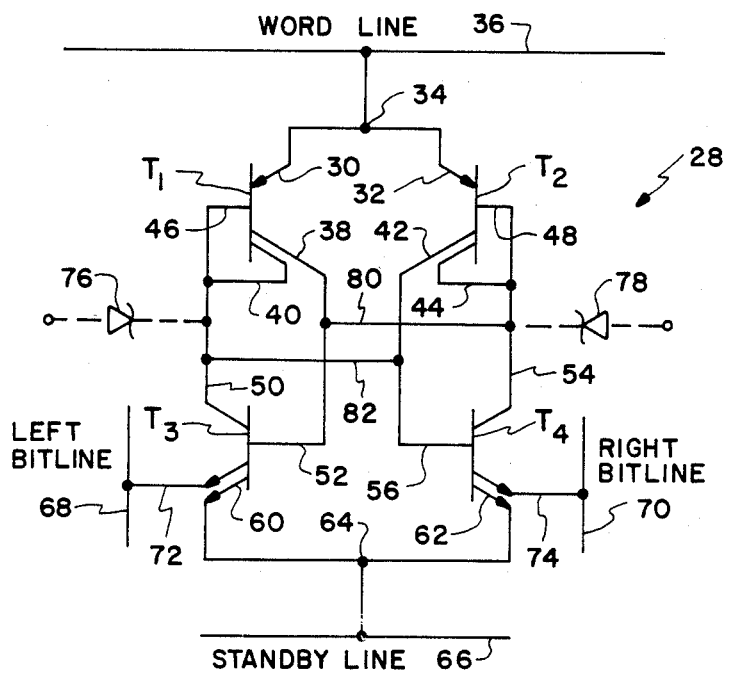
FIG. 2 is a schematic of the memory cell of the present invention.
Figure 3:
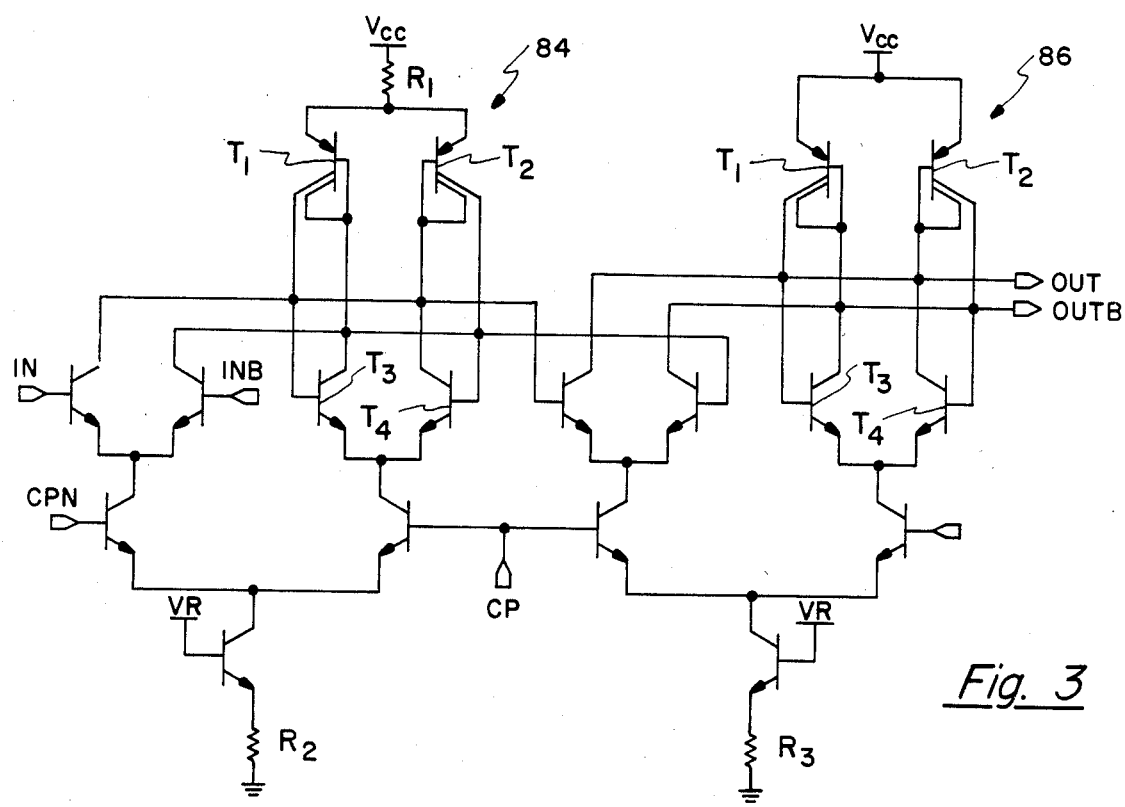
FIG. 3 is a schematic of a master-slave flip-flop which utilizes the present invention.

The present invention can also be employed as a memory cell of a register. An example of a master-slave flip-flop register using two cells 84 and 86 of the present invention is shown in FIG. 3. Corresponding transistors between FIGS. 2 and 3 are like-labelled. Note that the flip-flop includes resistors $R_1$, $R_2$ and $R_3$. It functions with input signals IN and INB (where INB is the complement of IN), clock signals CP and CPN (where CPN is the complement of CP), voltage reference VR, voltage supply VCC and outputs OUT and OUTB (where OUTB is the complement of OUT).

Note in cell 28 that the desirable features of the CTS cell (i.e., active load, use of merged transistors, lower substrate current and faster operation than the standard SCR cell) have been retained, yet the cell voltage differential is increased and Schottky diodes are not relied upon.

The cell voltage differential is increased because there is no Schottky diode clamping the base-collector voltage of the npn switching transistors $T_3$ and $T_4$. In turn, noise margin is increased making the cell more resistant to soft errors such as errors due to particle radiation.

Further, cell manufacturing is simplified without the need to form Schottky diodes, thus yield is increased.

FIG. 4 shows a sectional view of one half of cell 28, with corresponding structure between FIGS. 2 and 4 like-numbered.

The uses of the memory cell of the present invention have been given merely by way of example, the scope of the invention being defined solely by the claims.

What is claimed is:

1. A solid state memory cell comprising first and second active load, pnp transistors, each of said load transistors having a base, an emitter and first and second collectors, wherein the first collector of said first load transistor is directly connected to the base of said first load transistor, and the first collector of said second load transistor is directly connected to the base of said second load transistor, and wherein the emitters of said load transistors are connected to a first node; and first and second switching, npn transistors, each of said switching transistors having a base, a first emitter and a collector, wherein the second collector of said first load transistor is connected to the base of said first switching transistor and to the collector of said second switching transistor, and the second collector of said second load transistor is connected to the base of said second switching transistor and to the collector of said first switching transistor, wherein the base of said first load transistor is connected to the collector of said first switching transistor, and the base of said second load transistor is connected to the collector of said second switching transistor, and wherein the first emitters of said switching transistors are connected at a second node.

2. The cell of claim 1 further including a first Schottky diode having an anode and a cathode, with the cathode of said first Schottky diode connected to the collector of said first switching transistor, and a second Schottky diode having an anode and a cathode, with the cathode of said second Schottky diode connected to the collector of said second switching transistor.

3. The cell of claim 1 wherein the base of said first load transistor is also the collector of said first switching transistor, the base of said first switching transistor is also the second collector of the first load transistor, the base of said second load transistor is also the collector of said second switching transistor, and the base of said second switching transistor is also the second collector of the second load transistor.

4. The cell of claim 1 wherein said cell is part of a random access memory.

5. The cell of claim 1 wherein said cell is part of a flip-flop.

6. The cell of claim 1 further including a second emitter for each of said switching transistors.

7. The cell of claim 6 further including a conductive wordline, conductive standby line, and first and second conductive bit lines, wherein said wordline is connected to said first node, said standby line is connected to said second node, said first bitline is connected to the second emitter of said first switching transistor and the second bitline is connected to the second emitter of said second switching transistor.

* * * * *